United States Patent
Li et al.

(10) Patent No.: US 7,157,111 B2
(45) Date of Patent: *Jan. 2, 2007

(54) MOCVD SELECTIVE DEPOSITION OF C-AXIS ORIENTED $PB_5GE_3O_{11}$ THIN FILMS ON $IN_2O_3$ OXIDES

(75) Inventors: Tingkai Li, Vancouver, WA (US); Sheng Teng Hsu, Camas, WA (US); Bruce Dale Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 178 days.

This patent is subject to a terminal disclaimer.

(21) Appl. No.: 10/677,007

(22) Filed: Sep. 30, 2003

(65) Prior Publication Data

US 2005/0069643 A1    Mar. 31, 2005

(51) Int. Cl.
B05D 5/12     (2006.01)
C23C 16/00    (2006.01)

(52) U.S. Cl. ............ 427/100; 427/255.15; 427/255.19; 427/255.28; 427/255.32; 427/255.23; 427/255.7

(58) Field of Classification Search .................. 427/58, 427/100, 255.15, 255.19, 255.28, 255.32, 427/255.35, 255.7, 402; 438/3
See application file for complete search history.

(56) References Cited

U.S. PATENT DOCUMENTS

| | | | | |
|---|---|---|---|---|
| 5,573,171 A | * | 11/1996 | Kong et al. ............ | 228/123.1 |
| 6,190,925 B1 | * | 2/2001 | Li et al. ............ | 438/3 |
| 6,303,502 B1 | * | 10/2001 | Hsu et al. ............ | 438/680 |
| 6,407,422 B1 | * | 6/2002 | Asano et al. ............ | 257/306 |
| 6,475,813 B1 | * | 11/2002 | Li et al. ............ | 438/3 |
| 6,483,137 B1 | * | 11/2002 | Li et al. ............ | 257/295 |
| 6,495,378 B1 | * | 12/2002 | Li et al. ............ | 438/3 |
| 6,503,314 B1 | * | 1/2003 | Li et al. ............ | 106/287.19 |
| 6,616,857 B1 | * | 9/2003 | Li et al. ............ | 252/62.9 R |
| 6,664,116 B1 | * | 12/2003 | Li et al. ............ | 438/3 |
| 6,794,198 B1 | * | 9/2004 | Li et al. ............ | 438/3 |
| 6,825,519 B1 | * | 11/2004 | Li et al. ............ | 257/306 |
| 6,887,799 B1 | * | 5/2005 | Li et al. ............ | 438/778 |

FOREIGN PATENT DOCUMENTS

JP     04-324837    * 11/1992

* cited by examiner

Primary Examiner—Brian K. Talbot
(74) Attorney, Agent, or Firm—Robert D. Varitz, PC

(57) ABSTRACT

A method of selectively depositing a ferroelectric thin film on an indium-containing substrate in a ferroelectric device includes preparing a silicon substrate; depositing an indium-containing thin film on the substrate; patterning the indium containing thin film; annealing the structure; selectively depositing a ferroelectric layer by MOCVD; annealing the structure; and completing the ferroelectric device.

20 Claims, 3 Drawing Sheets

MOCVD SELECTIVE DEPOSITION OF C-AXIS ORIENTED PB$_5$GE$_3$O$_{11}$ THIN FILMS ON IN$_2$O$_3$ OXIDES

FIELD OF THE INVENTION

This invention relates to ferroelectric thin film processes, ferroelectric memory device structures and integrated processes for ferroelectric non-volatile memory devices, and specifically to a method of depositing a ferroelectric material onto an indium-containing electrode without the need subsequently to etch the ferroelectric material.

BACKGROUND OF THE INVENTION

Metal/FE/In$_2$O$_3$/Si or Metal/FE/oxide/In$_2$O$_3$/Si memory cells for one-transistor ferroelectric memory devices are desirable because they have a long memory retention time. For small devices and high-density applications, the integration process induced damage, such as, etching damage, results in retention, endurance, imprint, etc., problems. Therefore, reducing the damage is a critical issue for FeRAM memory devices.

SUMMARY OF THE INVENTION

A method of selectively depositing a ferroelectric thin film on an indium-containing substrate in a ferroelectric device includes preparing a silicon substrate; depositing an indium-containing thin film on the substrate; patterning the indium containing thin film; annealing the structure; selectively depositing a ferroelectric layer by MOCVD; annealing the structure; and completing the ferroelectric device.

It is an object of the invention to provide a selective deposition technique for ferroelectric thin films, such as C-axis Pb$_5$Ge$_3$O$_{11}$ (PGO) thin films, on In$_2$O$_3$/Si, In$_2$O$_3$/SiO$_2$ or high-k oxide/Si, to improve the properties of FeRAM ferroelectric memory devices.

Another object of the invention is to provide a method of depositing a ferroelectric on an indium-containing thin film without the need for subsequent etching of the ferroelectric material.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The invention is a method of selective deposition of ferroelectric thin films on indium-containing thin films, such as In$_2$O$_3$ thin film, which does not require subsequent etching, which results in improved properties of the fabricated FeRAM devices. The selective growth method of the invention of ferroelectric thin films, such as Pb$_5$Ge$_3$O$_{11}$ (PGO) thin films, on an indium-containing electrode, such as In$_2$O$_3$/Si, In$_2$O$_3$/SiO$_2$, or high-k oxide/Si, improves the properties of FeRAM ferroelectric memory devices by providing a larger memory window, e.g., $\geq$2V, and by providing a larger memory retention time. The method of the invention eliminates the need to etch the ferroelectric material, and, as a result, etching-induced damage is avoided. Because of the selective deposition of ferroelectric thin films on patterned In$_2$O$_3$/Si, In$_2$O$_3$/SiO$_2$, or high-k oxide/Si, rather than on a field oxide layer, any alignment problems are also resolved.

Figure 1:
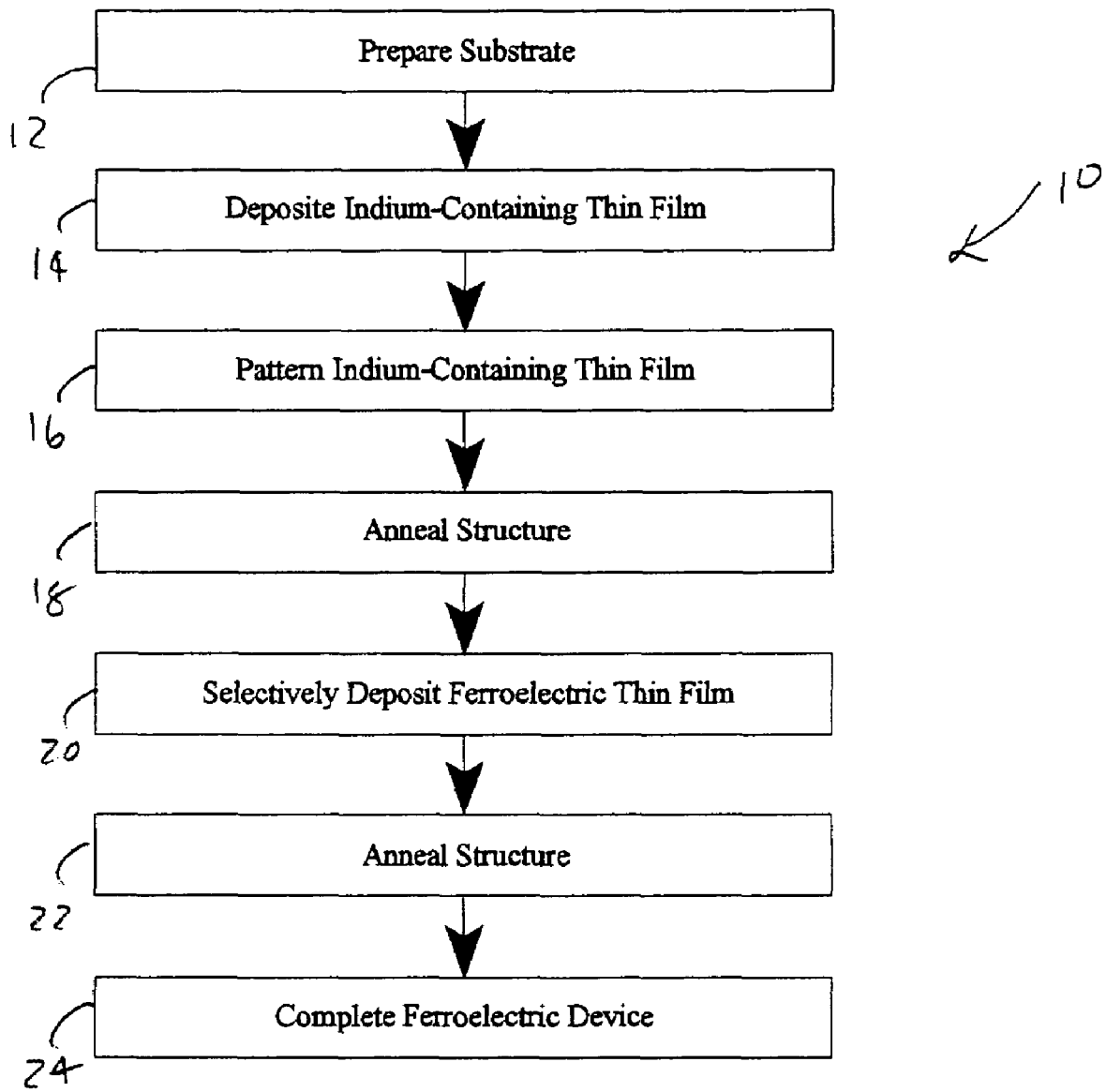
FIG. 1 is a block diagram of the method of the invention.

Substrates used in the demonstrated method of the invention for PGO MFS device fabrication are P-type silicon wafers. The steps of the method of the invention are as follows, and are depicted generally at 10 in FIG. 1:

A silicon (100) wafer is prepared, block 12, according to state-of-the-art techniques, and may include, in one embodiment of the method of the invention, formation of an oxide layer on the substrate. A high-k oxide layer, such as HfO, ZrO, Al$_2$O$_3$, La$_2$O$_3$, and alloys of the same, may be formed on the silicon substrate. A thin film, e.g., a layer having a thickness of between about 10 nm and 2 μm, of In$_2$O$_3$ is deposited, block 14, on silicon, SiO$_2$, or high-k oxide-on-silicon.

The In$_2$O$_3$ is patterned using an etching process, block 16. The following etching process of the method of the invention is used for patterning and etching In$_2$O$_3$ without excessively over etching an underlying SiO$_2$ layer. The In$_2$O$_3$ thin film, which is deposited on a SiO$_2$ layer, is coated with photoresist, and patterned by photolithography, and developed. After the patterned In$_2$O$_3$ thin film is placed in an etching chamber, the chamber pressure is maintained in a range of between about 3 mtorr. to 15 mtorr, with the best results being obtained at a pressure of about 6 mtorr. Etching chemicals, including BCl, delivered at a flow rate of between about 10 sccm to 60 sccm, with the best results being obtained at a flow rate of about 30 sccm, and Cl with a flow rate of between about 20 sccm to 100 sccm, with the best results being obtained at a flow rate of about 60 sccm, are delivered into the etching chamber. The Tcp RF plasma of about 350 W and a Bias RF plasma of about 150 W is generated, keeping the backward plasma smaller than 1%. Depending on the thickness of the In$_2$O$_3$ film, and the etching rates listed on Table 2, the etching time is controlled to avoid over etching. This is because In and In$_2$O$_3$ each have a higher etching rate than does SiO$_2$ when the etching method of the invention is used.

TABLE 1

Chemistry and Etching Parameters

| Items | BCl (sccm) | Cl (sccm) | Tcp RF (W) | Bias RF (W) | Pressure (mtorr) |
|---|---|---|---|---|---|
| Parameters | 30 | 60 | 350 | 150 | 6 |

TABLE 2

Etching rates for In, In$_2$O$_3$ and SiO$_2$ thin films

| Items | In | In$_2$O$_3$ | SiO$_2$ |
|---|---|---|---|
| Etching rates (nm/minute) | 100 | 80 | 60 |

A silica dioxide trench structure may be used for patterning the indium-containing thin film. The structure is annealed in an oxygen atmosphere, block 18, at between about 400° C. to 800° C. for between about 5 minutes to 50 minutes. This step may be carried out in situ in a MOCVD reactor prior to PGO thin film deposition. Selective deposition of the ferroelectric is still possible without this step, however, the quality of the ferroelectric film is lower than if this step is included.

A ferroelectric thin film, such as c-axis oriented $Pb_5Ge_3O_{11}$, (PGO), is deposited by MOCVD in a MOCVD reactor in a selective deposition step, block 20, on the patterned indium-containing thin film. The ferroelectric thin film is annealed, block 22, at a temperature of between about 500° C. to 600° C. for between about five minutes to six minutes in an oxygen atmosphere. The device is then completed, block 24.

P type silicon (100) wafers are used as the substrates for $In_2O_3$ thin film deposition. For a $In_2O_3$ thin film deposited on silicon, the silicon wafer is dipped in HF (50:1) for 5 seconds prior to deposition of the $In_2O_3$ thin film. For a $In_2O_3$ thin film deposited on $SiO_2$, the silicon wafer has $SiO_2$ layer deposited by CVD, which $SiO_2$ layer has a thickness of about 200 nm prior to deposition of $In_2O_3$. DC sputtering is used to deposit a indium-containing layer using an indium target. Deposition of a $In_2O_3$ thin film including depositing the thin film on a substrate at a deposition temperature of between about 20° C. to 300° C.; at a pressure of between about 1 torr to 10 torr; at an oxygen partial pressure of between about 0% to 60%, depending on which films, e.g., indium or $InO_x$, is to be deposited. The DC sputtering power is set to between about 200 W to 300 W, and the backward power is maintained to be smaller than 1%. The substrate temperatures is maintained at between about 20° C. to 200° C. After deposition of an $InO_x$ thin film, the post-annealing step is performed at a temperature of between about 400° C. to 800° C. for between about 5 minutes to 60 minutes in an oxygen atmosphere. The parameters are varied according to the desired resistance requirements of the memory device being fabricated according to the method of the invention.

In the case of a ferroelectric thin film deposited on an indium-containing layer, the deposition is performed at a temperature of between about 500° C. to 560° C.; a pressure of between about 1 torr to 10 torr; an oxygen partial pressure of between about 30% to 50%; a vaporizer temperature of between about 180° C. to 200° C.; a vaporizer pressure of between about 30 torr. to 50 torr.; and a solution delivery rate of between about 0.02 ml/min to 0.2 ml/min. The deposition time is between about 1 hour to 3 hours, depending on the desired film thickness. The structure is annealed at a temperature of between about 500° C. to 560° C. for between about 5 minutes to 30 minutes in an oxygen atmosphere, depending on the c-axis orientation of the ferroelectric layer.

The MOCVD selective deposition step includes preparation of a ferroelectric precursor solution, which, in the preferred embodiment, is [Pb(thd)$_2$] and [Ge(ETO)$_4$], where thd is $C_{11}H_{19}O_2$ and ETO is $OC_2H_5$, having a molar ratio of between about 5 to 5.5:3, which is dissolved in a mixed solvent of butyl ether or tetrahydrofuran {8}, isopropanol {2} and tetraglyme {1} in the molar ratio of about 8:2: 1. The precursor solution has a concentration of 0.1 M/L of PGO.

A single step deposition process includes injection the PGO precursor into a vaporizer of the MOCVD reactor at a temperature of between about 150° C. to 240° C. by a pump at a rate of between about 0.02 ml/min to 0.2 ml/min to form the precursor gas. The feed line is kept at a temperature of between about 150° C. to 245° C. during MOCVD.

A two step deposition process includes a nucleation step, using a deposition temperature of between about 500° C. to 560° C. for between about 5 minutes to 20 minutes, followed by a second, growth step which includes selective PGO deposition at a deposition temperature of between about 500° C. to 560° C.; a deposition reactor pressure of between about 1 torr. to 10 torr.; an oxygen partial pressure of between about 30%–50%; a vaporizer temperature of between about 200° C. to 240° C.; a precursor solution delivery rate of between about 0.1 ml/min–0.2 ml/min; a deposition time of between about 1 hour to 3 hours, depending on desired film thickness; an annealing temperature of between about 500° C. to 560° C.; and an annealing time of between about 5 minutes to 30 minutes in an oxygen atmosphere.

Experimental Results

Figure 2:
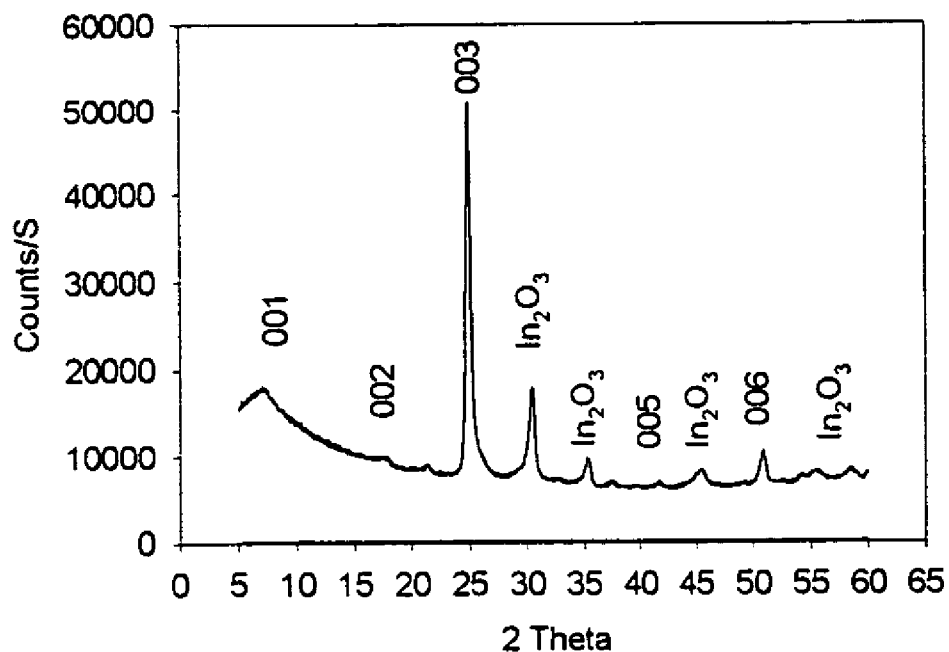
FIG. 2 is an x-ray pattern of PGO thin film deposited by the method of the invention.

The phases of the films were identified using x-ray diffraction. The microstructures are measured by microscope. FIG. 2 depicts the x-ray pattern of a PGO thin film deposited according to the method of the invention. Results are similar regardless of whether the PGO is deposited on $In_2O_3$/Si, $In_2O_3$/$SiO_2$, or high-k oxide on silicon. As is shown in the figure, an extremely high c-axis oriented PGO thin film is obtained.

Because the large differences between the deposition rates of PGO grown on $In_2O_3$/Si to PGO grown on $SiO_2$, as shown in the Table 3, PGO may be selectively deposited on $In_2O_3$ more efficiently than on $SiO_2$ according to the method of the invention.

TABLE 3

Deposition Rates of PGO Grown on $In_2O_3$ and $SiO_2$

| | Deposition rates (nm/hour) | Crystallization |
|---|---|---|
| PGO on $In_2O_3$ | 200–300 | Oriented crystallized film |
| PGO on $SiO_2$ | 1–5 | Amorphous film |

Figure 3:
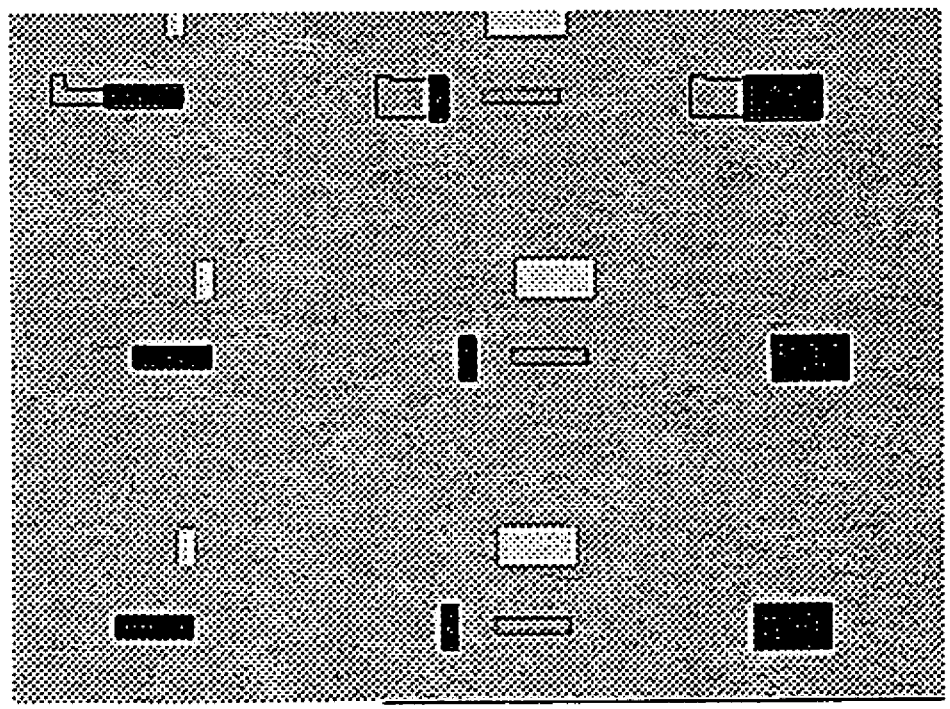
FIGS. 3 and 4 are microphotographs of selectively deposited PGO on an In$_2$O$_3$/Si substrate.
Figure 4:
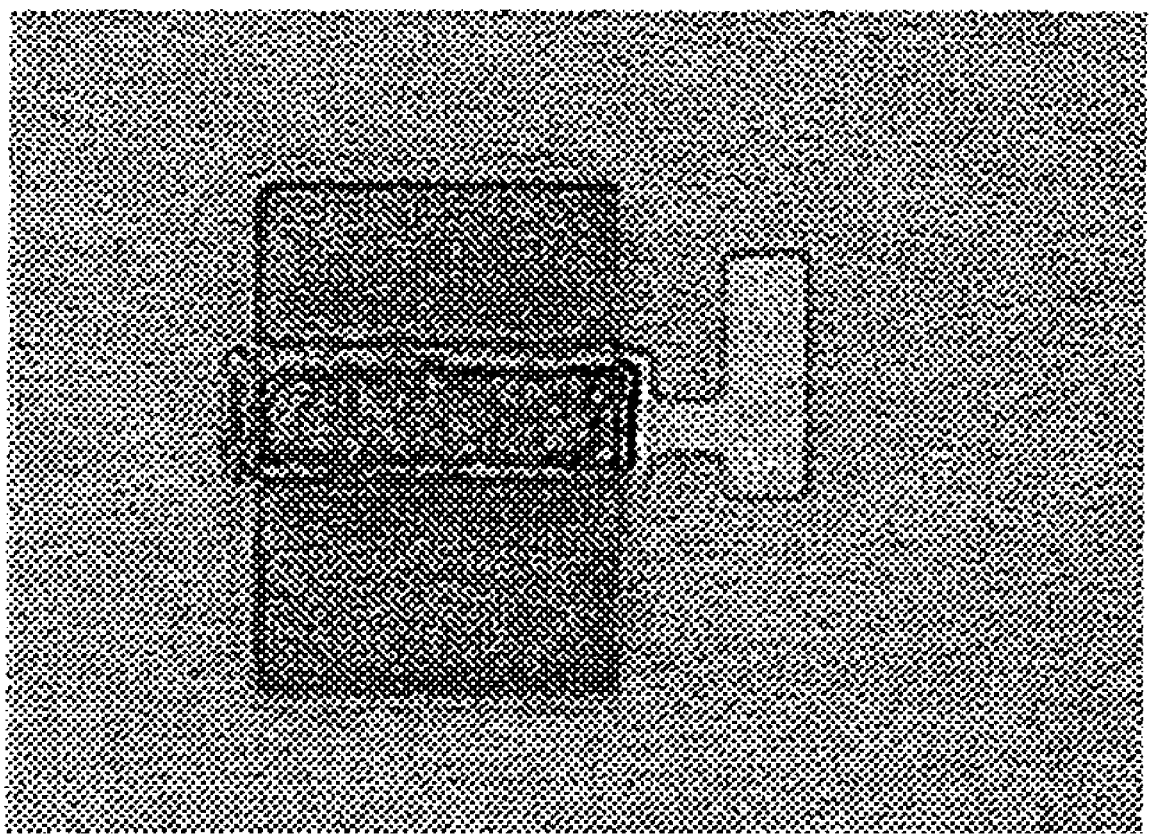

FIGS. 3 and 4 are microphotographs of selective deposition of PGO thin films on $In_2O_3$. These figures confirm that a PGO thin film has been selectively deposited on $In_2O_3$ and not on the surrounding $SiO_2$.

Thus, a method for MOCVD selective deposition of ferroelectric thin films on indium-containing substrates has been disclosed. It will be appreciated that further variations and modifications thereof may be made within the scope of the invention as defined in the appended claims.

We claim:

1. A method of selectively depositing a ferroelectric thin film on an indium-containing layer in a ferroelectric device comprising:
    preparing a silicon substrate;
    depositing an indium-containing thin film on the substrate;
    patterning the indium containing thin film;
    annealing the structure;
    selectively depositing a ferroelectric layer by MOCVD on the indium-containing thin film; and
    annealing the structure.

2. The method of claim 1 wherein said preparing includes forming an oxide layer on the silicon substrate.

3. The method of claim 1 wherein said preparing includes forming a high-k oxide on the silicon substrate.

4. The method of claim 1 wherein said patterning includes etching the indium-containing thin film.

5. The method of claim 1 wherein said patterning the indium-containing thin film includes forming a silica dioxide trench structure.

6. The method of claim 1 wherein said depositing of an indium-containing thin film includes deposition of a $In_2O_3$ thin film, and which further includes depositing the $In_2O_3$ thin film on a substrate at a deposition temperature of between about 20° C. to 300° C. and a substrate temperatures of between about 20° C. to 200° C.; a chamber pressure of between about 1 torr to 10 torr; an oxygen partial pressure of between about 0% to 60%; a DC sputtering power of between about 200 W to 300 W, and a backward power less than 1%; and post-annealing at a temperature of between about 400° C. to 800° C. for between about 5 minutes to 60 minutes in an oxygen atmosphere.

7. The method of claim 1 wherein said selectively depositing a ferroelectric layer includes depositing a PGO layer includes preparing a PGO precursor of $[Pb(thd)_2]$ and $[Ge(ETO)_4]$, where thd is $C_{11}H_{19}O_2$ and ETO is $OC_2H_5$, having a molar ratio of between about 5 to 5.5:3, which is dissolved in a mixed solvent of butyl ether or tetrahydrofuran, isopropanol and tetraglyme in the molar ratio of about 8:2:1 to form a precursor solution; wherein the precursor solution has a concentration of 0.1 M/L of PGO; injecting precursor solution into a vaporizer of the MOCVD reactor at a temperature of between about 150° C. to 240° C. at a rate of between about 0.02 ml/min to 0.2 ml/min to form a precursor gas; maintaining a precursor gas feed line at a temperature of between about 150° C. to 245° C. during MOCVD; maintaining the MOCVD reactor at a temperature of between about 500° C. to 560° C.; a pressure of between about 1 torr. to 10 torr.; an oxygen partial pressure of between about 30%–50%; a vaporizer temperature of between about 200° C. to 240° C.; a precursor solution delivery rate of between about 0.1 ml/min–0.2 ml/min; a deposition time of between about 1 hour to 3 hours; an annealing temperature of between about 500° C. to 560° C.; and an annealing time of between about 5 minutes to 30 minutes in an oxygen atmosphere.

8. The method of claim 7 wherein said selectively depositing a ferroelectric layer includes depositing a PGO layer which further includes preparing a PGO precursor of $[Pb(thd)_2]$ and $[Ge(ETO)_4]$, where thd is $C_{11}H_{19}O_2$ and ETO is $OC_2H_5$, having a molar ratio of between about 5 to 5.5:3, which is dissolved in a mixed solvent of butyl ether or tetrahydrofuran, isopropanol and tetraglyme in the molar ratio of about 8:2:1 to form a precursor solution; wherein the precursor solution has a concentration of 0.1 M/L of PGO; injecting precursor solution into a vaporizer of the MOCVD reactor at a temperature of between about 150° C. to 240° C. at a rate of between about 0.02 ml/min to 0.2 ml/min to form a precursor gas; maintaining a precursor gas feed line at a temperature of between about 150° C. to 245° C. during MOCVD; forming the PGO layer in a first, nucleation step, using a deposition temperature of between about 500° C. to 560° C. for between about 5 minutes to 20 minutes; followed by a second, growth step which includes selective PGO deposition at a deposition temperature of between about 500° C. to 560° C.; a deposition reactor pressure of between about 1 torr. to 10 torr.; an oxygen partial pressure of between about 30%–50%; a vaporizer temperature of between about 200° C. to 240° C.; a precursor solution delivery rate of between about 0.1 ml/min–0.2 ml/min; a deposition time of between about 1 hour to 3 hours; annealing the PGO layer at an annealing temperature of between about 500° C. to 560° C.; and an annealing time of between about 5 minutes to 30 minutes in an oxygen atmosphere.

9. A method of selectively depositing a ferroelectric thin film on an indium-containing layer in a ferroelectric device comprising:

preparing a silicon substrate;
depositing an $In_2O_3$ thin film having a thickness of between about 10 nm and 2 μm on the substrate;
patterning the $In_2O_3$ thin film;
annealing the structure;
selectively depositing a PGO layer by MOCVD on the $In_2O_3$ thin film; and
annealing the structure.

10. The method of claim 9 wherein said preparing includes forming an oxide layer on the silicon substrate.

11. The method of claim 9 wherein said preparing includes forming a high-k oxide on the silicon substrate, wherein the high-k material is taken from the group of materials consisting of HfO, ZrO, $Al_2O_3$, $La_2O_3$, and alloys thereof.

12. The method of claim 9 wherein said patterning includes etching the $In_2O_3$ thin film.

13. The method of claim 9 wherein said patterning the $In_2O_3$ thin film includes forming a silica dioxide trench structure.

14. The method of claim 9 wherein said depositing a $In_2O_3$ thin film includes depositing the thin film on a substrate at a deposition temperature of between about 20° C. to 300° C. and a substrate temperatures of between about 20° C. to 200° C.; a chamber pressure of between about 1 torr to 10 torr; an oxygen partial pressure of between about 0% to 60%; a DC sputtering power of between about 200 W to 300 W, and a backward power less than 1%; and post-annealing at a temperature of between about 400° C. to 800° C. for between about 5 minutes to 60 minutes in an oxygen atmosphere.

15. The method of claim 9 wherein said selectively depositing a PGO layer includes preparing a PGO precursor of $[Pb(thd)_2]$ and $[Ge(ETO)_4]$, where thd is $C_{11}H_{19}O_2$ and ETO is $OC_2H_5$, having a molar ratio of between about 5 to 5.5:3, which is dissolved in a mixed solvent of butyl ether or tetrahydrofuran, isopropanol and tetraglyme in the molar ratio of about 8:2:1 to form a precursor solution; wherein the precursor solution has a concentration of 0.1 M/L of PGO; injecting precursor solution into a vaporizer of the MOCVD reactor at a temperature of between about 150° C. to 240° C. at a rate of between about 0.02 ml/min to 0.2 ml/min to form a precursor gas; maintaining a precursor gas feed line at a temperature of between about 150° C. to 245° C. during MOCVD; maintaining the MOCVD reactor at a temperature of between about 500° C. to 560° C.; a pressure of between about 1 torr. to 10 torr.; an oxygen partial pressure of between about 30%–50%; a vaporizer temperature of between about 200° C. to 240° C.; a precursor solution delivery rate of between about 0.1 ml/min–0.2 ml/min; a deposition time of between about 1 hour to 3 hours; an annealing temperature of between about 500° C. to 560° C.; and an annealing time of between about 5 minutes to 30 minutes in an oxygen atmosphere.

16. The method of claim 9 wherein said selectively depositing a PGO layer includes preparing a PGO precursor of $[Pb(thd)_2]$ and $[Ge(ETO)_4]$, where thd is $C_{11}H_{19}O_2$ and ETO is $OC_2H_5$, having a molar ratio of between about 5 to 5.5:3, which is dissolved in a mixed solvent of butyl ether or tetrahydrofuran, isopropanol and tetraglyme in the molar ratio of about 8:2:1 to form a precursor solution; wherein the precursor solution has a concentration of 0.1 M/L of PGO; injecting precursor solution into a vaporizer of the MOCVD reactor at a temperature of between about 150° C. to 240° C. at a rate of between about 0.02 ml/min to 0.2 ml/min to form a precursor gas; maintaining a precursor gas feed line at a temperature of between about 150° C. to 245° C. during MOCVD; forming the PGO layer in a first, nucleation step, using a deposition temperature of between about 500° C. to 560° C. for between about 5 minutes to 20 minutes; followed by a second, growth step which includes selective PGO deposition at a deposition temperature of between about 500° C. to 560° C.; a deposition reactor pressure of between about 1 torr. to 10 torr.; an oxygen partial pressure of between about 30%–50%; a vaporizer temperature of between about 200° C. to 240° C.; a precursor solution delivery rate of between about 0.1 ml/min–0.2 ml/min; a deposition time of between about 1 hour to 3 hours; annealing the PGO layer at an annealing temperature of between about 500° C. to 560° C.; and an annealing time of between about 5 minutes to 30 minutes in an oxygen atmosphere.

17. A method of selectively depositing a ferroelectric thin film on an indium-containing layer in a ferroelectric device comprising:
preparing a silicon substrate;
forming a silicon oxide layer on the silicon substrate
depositing an $In_2O_3$ layer having a thickness of between about 10 nm and 2 μm on the silicon oxide layer;
patterning the $In_2O_3$ layer, including etching the $In_2O_3$ layer, leaving the silicon oxide layer surrounding the $In_2O_3$ layer;
annealing the structure;
selectively depositing a PGO layer by MOCVD on the $In_2O_3$ layer wherein MOCVD of PGO on the $In_2O_3$ layer is about two orders of magnitude greater than that of MOCVD of PGO on the surrounding silicon oxide layer, thus depositing the PGO to the desired form on the $In_2O_3$ layer and eliminating the need for etching of the PGO layer; and
annealing the structure.

18. The method of claim 17 wherein said depositing a $In_2O_3$ thin film includes depositing the thin film on a substrate at a deposition temperature of between about 20° C. to 300° C. and a substrate temperatures of between about 20° C. to 200° C.; a chamber pressure of between about 1 torr to 10 torr; an oxygen partial pressure of between about 0% to 60%; a DC sputtering power of between about 200 W to 300 W, and a backward power less than 1%; and post-annealing at a temperature of between about 400° C. to 800° C. for between about 5 minutes to 60 minutes in an oxygen atmosphere.

19. The method of claim 17 wherein said selectively depositing a PGO layer includes preparing a PGO precursor of $[Pb(thd)_2]$ and $[Ge(ETO)_4]$, where thd is $C_{11}H_{19}O_2$ and ETO is $OC_2H_5$, having a molar ratio of between about 5 to 5.5:3, which is dissolved in a mixed solvent of butyl ether or tetrahydrofuran, isopropanol and tetraglyme in the molar ratio of about 8:2:1 to form a precursor solution; wherein the precursor solution has a concentration of 0.1 M/L of PGO; injecting precursor solution into a vaporizer of the MOCVD reactor at a temperature of between about 150° C. to 240° C. at a rate of between about 0.02 ml/min to 0.2 ml/min to form a precursor gas; maintaining a precursor gas feed line at a temperature of between about 150° C. to 245° C. during MOCVD; maintaining the MOCVD reactor at a temperature of between about 500° C. to 560° C.; a pressure of between about 1 torr. to 10 torr.; an oxygen partial pressure of between about 30%–50%; a vaporizer temperature of between about 200° C. to 240° C.; a precursor solution delivery rate of between about 0.1 ml/min–0.2 ml/min; a deposition time of between about 1 hour to 3 hours; an annealing temperature of between about 500° C. to 560° C.; and an annealing time of between about 5 minutes to 30 minutes in an oxygen atmosphere.

20. The method of claim 17 wherein said selectively depositing a PGO layer includes preparing a PGO precursor of $[Pb(thd)_2]$ and $[Ge(ETO)_4]$, where thd is $C_{11}H_{19}O_2$ and ETO is $OC_2H_5$, having a molar ratio of between about 5 to 5.5:3, which is dissolved in a mixed solvent of butyl ether or tetrahydrofuran, isopropanol and tetraglyme in the molar ratio of about 8:2:1 to form a precursor solution; wherein the precursor solution has a concentration of 0.1 M/L of PGO; injecting precursor solution into a vaporizer of the MOCVD reactor at a temperature of between about 150° C. to 240° C. at a rate of between about 0.02 ml/min to 0.2 ml/min to form a precursor gas; maintaining a precursor gas feed line at a temperature of between about 150° C. to 245° C. during MOCVD; forming the PGO layer in a first, nucleation step, using a deposition temperature of between about 500° C. to 560° C. for between about 5 minutes to 20 minutes; followed by a second, growth step which includes selective PGO deposition at a deposition temperature of between about 500° C. to 560° C.; a deposition reactor pressure of between about 1 torr. to 10 torr.; an oxygen partial pressure of between about 30%–50%; a vaporizer temperature of between about 200° C. to 240° C.; a precursor solution delivery rate of between about 0.1 ml/min–0.2 ml/min; a deposition time of between about 1 hour to 3 hours; annealing the PGO layer at an annealing temperature of between about 500° C. to 560° C.; and an annealing time of between about 5 minutes to 30 minutes in an oxygen atmosphere.

* * * * *